(12) United States Patent
Tanabe et al.

(10) Patent No.: US 10,028,378 B2
(45) Date of Patent: Jul. 17, 2018

(54) SUSPENSION BOARD WITH CIRCUIT AND PRODUCING METHOD THEREOF

(71) Applicant: NITTO DENKO CORPORATION, Osaka (JP)

(72) Inventors: Hiroyuki Tanabe, Osaka (JP); Naohiro Terada, Osaka (JP); Yuu Sugimoto, Osaka (JP); Daisuke Yamauchi, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 34 days.

(21) Appl. No.: 15/373,573

(22) Filed: Dec. 9, 2016

(65) Prior Publication Data

US 2017/0171969 A1 Jun. 15, 2017

(30) Foreign Application Priority Data

Dec. 11, 2015 (JP) .................. 2015-242585

(51) Int. Cl.
| | |
|---|---|
| *H05K 1/05* | (2006.01) |
| *H05K 1/11* | (2006.01) |
| *H05K 1/18* | (2006.01) |
| *G11B 5/48* | (2006.01) |
| *H05K 3/40* | (2006.01) |
| *H05K 3/44* | (2006.01) |
| *H05K 1/02* | (2006.01) |
| *H05K 1/03* | (2006.01) |

(52) U.S. Cl.
CPC ............. *H05K 1/05* (2013.01); *G11B 5/4826* (2013.01); *G11B 5/4853* (2013.01); *H05K 1/11* (2013.01); *H05K 1/18* (2013.01); *H05K 3/4007* (2013.01); *H05K 3/44* (2013.01); *G11B 5/484* (2013.01); *H05K 1/0278* (2013.01); *H05K 1/0393* (2013.01); *H05K 2201/10227* (2013.01)

(58) Field of Classification Search
CPC .......... H05K 1/05; H05K 3/44; H05K 3/4007; H05K 1/11; H05K 2201/10227; G11B 5/4826; G11B 5/4853
See application file for complete search history.

(56) References Cited

U.S. PATENT DOCUMENTS

| | | | | |
|---|---|---|---|---|
| 2012/0087041 A1* | 4/2012 | Ohsawa | ............... | G11B 5/4826 360/234.5 |
| 2012/0092794 A1* | 4/2012 | Ohsawa | ................. | G11B 5/486 360/246.2 |
| 2013/0020112 A1* | 1/2013 | Ohsawa | ............... | G11B 5/4853 174/255 |

FOREIGN PATENT DOCUMENTS

JP 2012-099204 A 5/2012

* cited by examiner

*Primary Examiner* — Ishwarbhai B Patel
(74) *Attorney, Agent, or Firm* — Edwards Neils, LLC; Jean C. Edwards, Esq.

(57) ABSTRACT

A suspension board with circuit includes a metal supporting board, a base insulating layer disposed at one side in a thickness direction of the metal supporting board, and a conductor layer disposed at one side in the thickness direction of the base insulating layer and including a connecting terminal electrically connected to a slider. The base insulating layer has a terminal region, when projected in the thickness direction, overlapped with at least the connecting terminal and a circumferential region not overlapped with the terminal region and around the terminal region, and the thickness of the terminal region is thicker than that of the circumferential region.

5 Claims, 7 Drawing Sheets

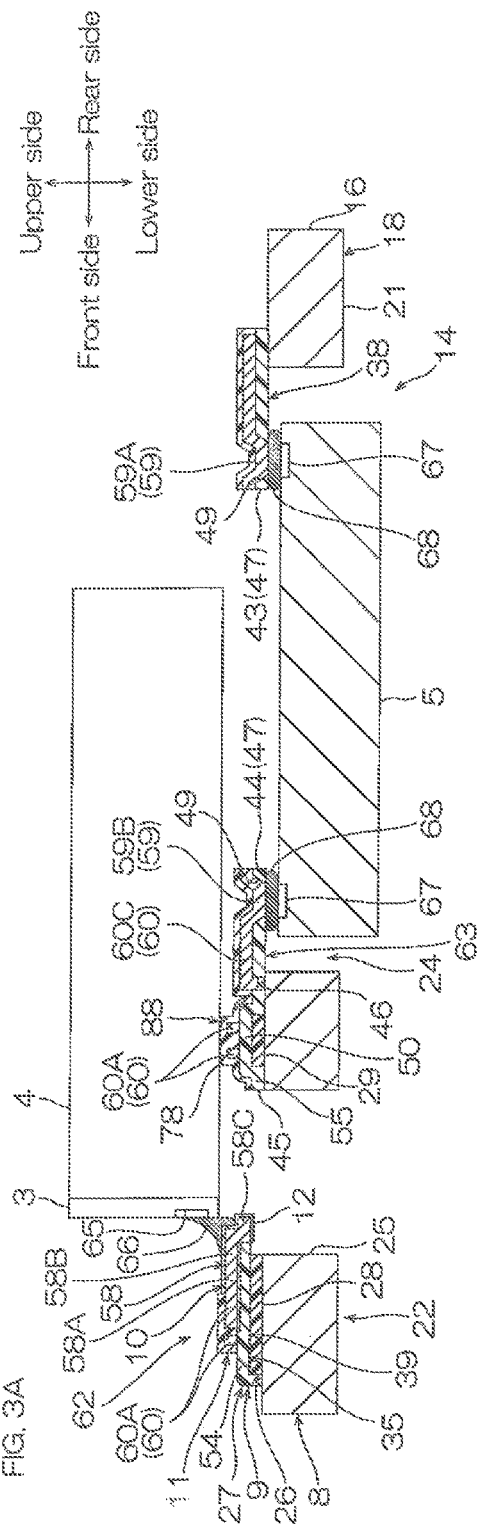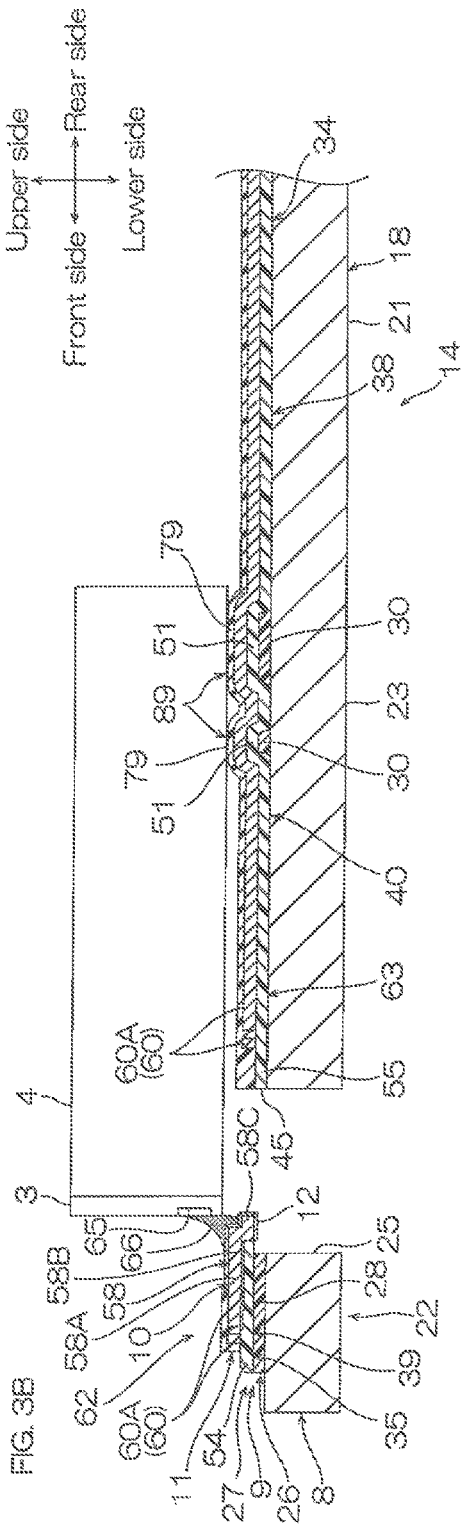

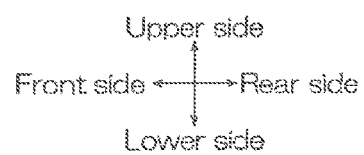
FIG. 4A
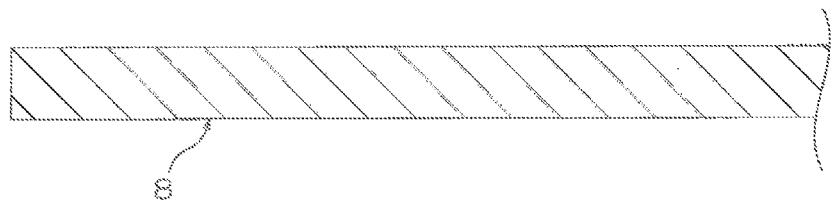
FIG. 4B
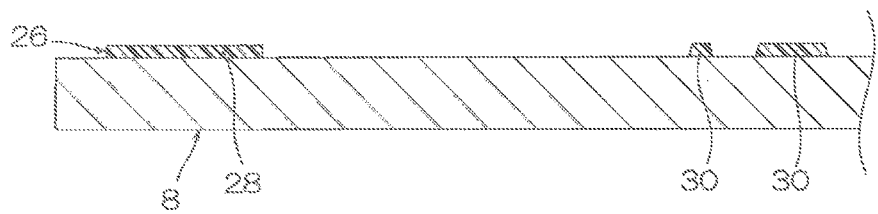
FIG. 4C
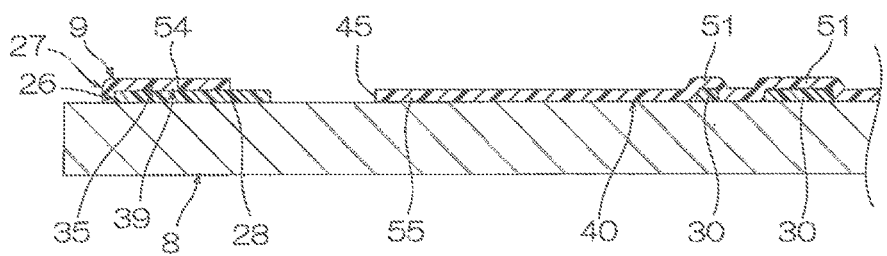

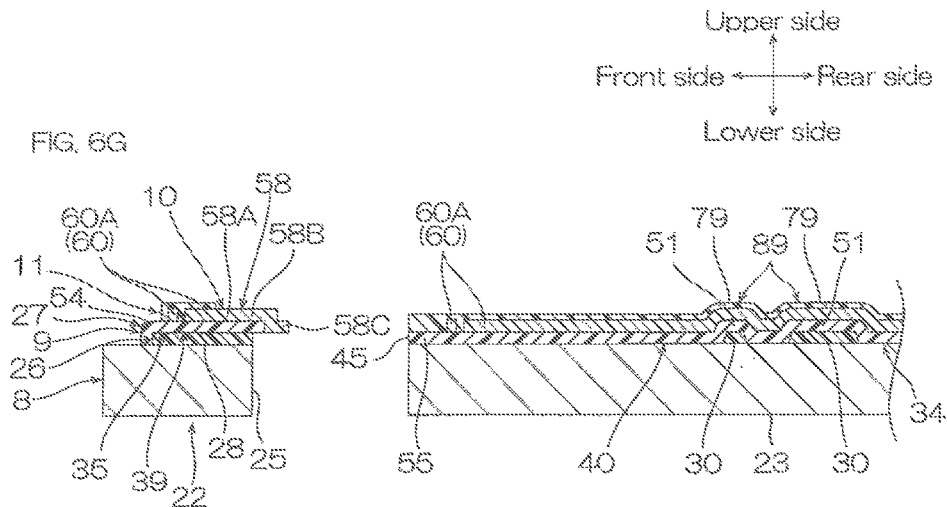
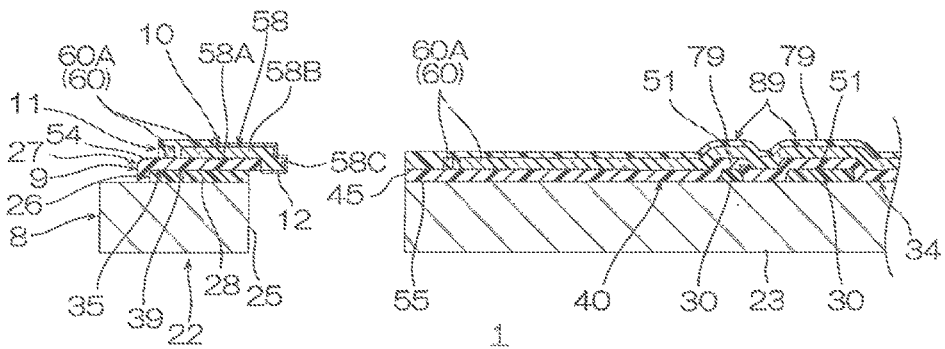
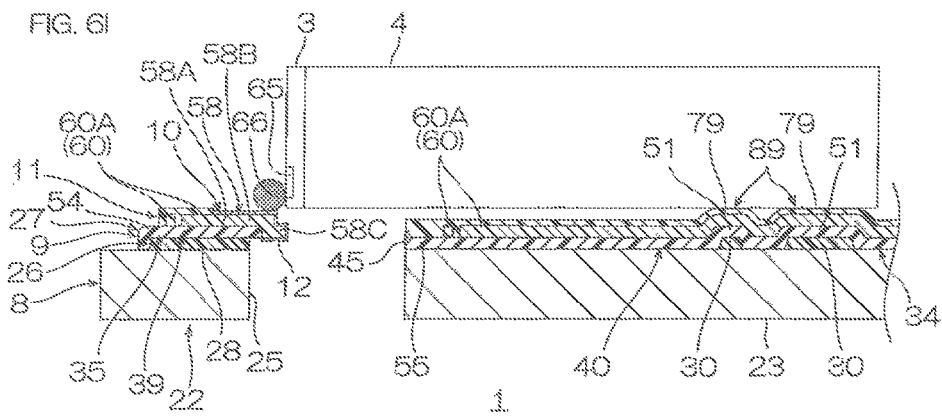

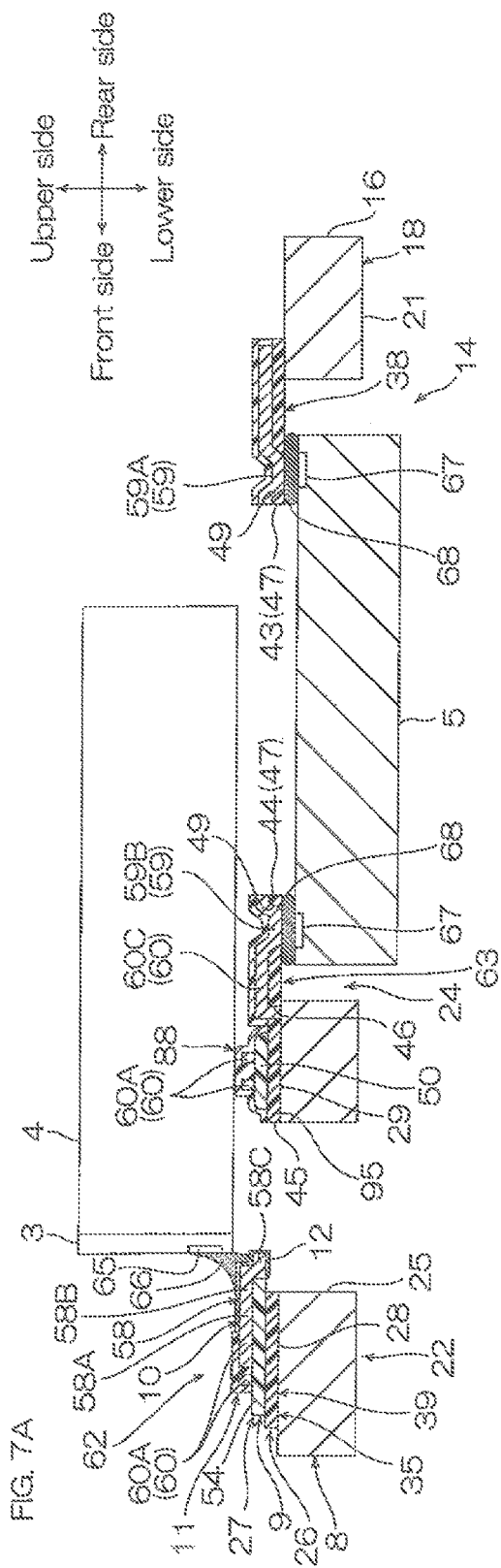

SUSPENSION BOARD WITH CIRCUIT AND PRODUCING METHOD THEREOF

CROSS-REFERENCE TO RELATED APPLICATION

The present application claims priority from Japanese Patent Application No. 2015-242585 filed on Dec. 11, 2015, the contents of which are hereby incorporated by reference into this application.

BACKGROUND OF THE INVENTION

Field of the Invention

The present invention relates to a suspension board with circuit, to be specific, to a suspension board with circuit used for a hard disk drive, and a producing method thereof.

Description of Related Art

Conventionally, a suspension board with circuit on which a slider including a magnetic head is mounted is mounted on a hard disk drive.

In such a suspension board with circuit, a head-side terminal is electrically connected to a terminal of the magnetic head of the slider by a solder ball (ref: for example, Japanese Unexamined Patent Publication No. 2012-099204).

SUMMARY OF THE INVENTION

In the suspension board with circuit described in Japanese Unexamined Patent Publication No. 2012-099204, however, the bead-side terminal is spaced apart from the terminal of the magnetic head in a thickness direction. When the space therebetween is large, there may be a case where the contact area of the head-side terminal and the terminal of the magnetic head cannot be ensured at the time of melting of the solder ball, causing a contact failure.

It is an object of the present invention to provide a suspension board with circuit that is capable of surely connecting a connecting terminal to a terminal of a slider, and a producing method thereof.

The present invention [1] includes a suspension board with circuit including a metal supporting board, a base insulating layer disposed at one side in a thickness direction of the metal supporting board, and a conductor layer disposed at one side in the thickness direction of the base insulating layer and including a connecting terminal electrically connected to a slider, wherein the base insulating layer has a terminal region, when projected in the thickness direction, overlapped with at least the connecting terminal and a circumferential region not overlapped with the terminal region and around the terminal region, and the thickness of the terminal region is thicker than that of the circumferential region.

According to the structure, the thickness of the terminal region is thicker than that of the circumferential region, so that the connecting terminal can be brought closer to a terminal of a slider in the thickness direction.

Thus, the connecting terminal can be surely connected to the terminal of the slider.

On the other hand, the thickness of the circumferential region is thinner than that of the terminal region, so that light weight and thinning of the suspension board with circuit can be achieved.

The present invention [2] includes the suspension board with circuit described in the above-described [1], wherein the base insulating layer includes a first base insulating layer disposed at the one side in the thickness direction of the metal supporting board and a second base insulating layer covering the first base insulating layer and disposed at the one side in the thickness direction of the metal supporting board; the terminal region includes a first terminal region-insulating layer made of the first base insulating layer and disposed at the one side in the thickness direction of the metal supporting board and a second terminal region-insulating layer made of the second base insulating layer and disposed at one side in the thickness direction of the first terminal region-insulating layer; and the circumferential region includes at least a second circumferential region-insulating layer made of the second base insulating layer and disposed at the one side in the thickness direction of the metal supporting board.

According to the structure, the terminal region includes the first terminal region-insulating layer made of the first base insulating layer and the second terminal region-insulating layer made of the second base insulating layer, while the circumferential region includes the second circumferential region-insulating layer made of the second base insulating layer.

Thus, compared to a case where the terminal region is formed of one layer of the base insulating layer, by forming the thickness of the terminal region in two layers, that is, the first terminal region-insulating layer and the second terminal region-insulating layer, the thickness of the terminal region can be easily formed thicker than that of the circumferential region.

As a result, the connecting terminal can be brought closer to the terminal of the slider, so that the connecting terminal can be more surely connected to the terminal of the slider.

The present invention [3] includes the suspension board with circuit described in the above-described [2] further including a cover insulating layer covering the conductor layer so as to expose the connecting terminal and disposed at the one side in the thickness direction of the base insulating layer and a pedestal supporting the slider, wherein the pedestal includes a first base pedestal layer made of the first base insulating layer and disposed at the one side in the thickness direction of the metal supporting board, a second base pedestal layer made of the second base insulating layer and disposed at one side in the thickness direction of the first base pedestal layer, and a cover pedestal layer made of the cover insulating layer and disposed at one side in the thickness direction of the second base pedestal layer.

According to the structure, the first base pedestal layer is made of the first base insulating layer, the second base pedestal layer is made of the second base insulating layer, and the cover pedestal layer is made of the cover insulating layer, so that the pedestal can be formed without separately providing a member so as to support the slider.

The present invention [4] includes the suspension board with circuit described in the above-described [1], wherein the base insulating layer includes a first base insulating layer disposed at the one side in the thickness direction of the metal supporting board and a second base insulating layer disposed at one side in the thickness direction of the first base insulating layer, the terminal region includes a first terminal region-insulating layer made of the first base insulating layer and disposed at the one side in the thickness direction of the metal supporting board and a second terminal region-insulating layer made of the second base insulating layer and disposed at one side in the thickness direction of the first terminal region-insulating layer; and the circumferential region includes at least a first circumferential region-insulating layer made of the first base insulating layer and disposed at the one side in the thickness direction of the metal supporting board.

According to the structure, the terminal region includes the first terminal region-insulating layer made of the first base insulating layer and the second terminal region-insulating layer made of the second base insulating layer, while the circumferential region includes the first circumferential region-insulating layer made of the first base insulating layer.

Thus, compared to a case where the terminal region is formed of one layer of the base insulating layer, by forming the thickness of the terminal region in two layers, that is, the first terminal region-insulating layer and the second terminal region-insulating layer, the thickness of the terminal region can be easily formed thicker than that of the circumferential region.

As a result, the connecting terminal can be brought closer to the terminal of the slider, so that the connecting terminal can be more surely connected to the terminal of the slider.

The present invention [5] includes the suspension board with circuit described in the above-described [4] further including a cover insulating layer covering the conductor layer so as to expose the connecting terminal and disposed at the one side in the thickness direction of the base insulating layer and a pedestal supporting the slider, wherein the pedestal includes a first base pedestal layer made of the first base insulating layer and disposed at the one side in the thickness direction of the metal supporting board, a second base pedestal layer made of the second base insulating layer and disposed at one side in the thickness direction of the first base pedestal layer, and a cover pedestal layer made of the cover insulating layer and disposed at one side in the thickness direction of the second base pedestal layer.

According to the structure, the first base pedestal layer is made of the first base insulating layer, the second base pedestal layer is made of the second base insulating layer, and the cover pedestal layer is made of the cover insulating layer, so that the pedestal can be formed without separately providing a member so as to support the slider.

The present invention [6] includes a method for producing a suspension board with circuit described in the above-described [3] including the steps of preparing the metal supporting board, forming the first base insulating layer so as to dispose at least the first terminal region-insulating layer at the one side in the thickness direction of the metal supporting board and the first base pedestal layer at the one side in the thickness direction of the metal supporting board, forming the second base insulating layer so as to dispose the second terminal region-insulating layer at the one side in the thickness direction of the first terminal region-insulating layer, the second circumferential region-insulating layer at the one side in the thickness direction of the metal supporting board, and the second base pedestal layer at the one side in the thickness direction of the first base pedestal layer, forming the conductor layer including the connecting terminal at the one side in the thickness direction of the base insulating layer, and forming the cover insulating layer exposing the connecting terminal and covering the conductor layer so as to dispose the cover pedestal layer at the one side in the thickness direction of the second base pedestal layer.

According to the method, the suspension board with circuit in which the thickness of the terminal region is thicker than that of the circumferential region, and the connecting terminal can be brought closer to the terminal of the slider in the thickness direction can be produced.

Also, in the steps of forming the second terminal region-insulating layer and the second circumferential region-insulating layer, the second base pedestal layer can be simultaneously formed.

Thus, the pedestal can be efficiently formed without separately adding a step, while the connecting terminal can be surely brought closer to the terminal of the slider.

The present invention [7] includes a method for producing a suspension board with circuit described in the above-described [5] including the steps of preparing the metal supporting board, forming the first base insulating layer so as to dispose the first terminal region-insulating layer at the one side in the thickness direction of the metal supporting board, the first circumferential region-insulating layer at the one side in the thickness direction of the metal supporting board, and the first base pedestal layer at the one side in the thickness direction of the metal supporting board, forming the second base insulating layer so as to dispose at least the second terminal region-insulating layer at the one side in the thickness direction of the first terminal region-insulating layer and the second base pedestal layer at the one side in the thickness direction of the first base pedestal layer, forming the conductor layer including the connecting terminal at the one side in the thickness direction of the base insulating layer, and forming the cover insulating layer exposing the connecting terminal and covering the conductor layer so as to dispose the cover pedestal layer at the one side in the thickness direction of the second base pedestal layer.

According to the method, the suspension board with circuit in which the thickness of the terminal region is thicker than that of the circumferential region, and the connecting terminal can be brought closer to the terminal of the slider in the thickness direction can be produced.

Also, in the steps of forming the first terminal region-insulating layer and the first circumferential region-insulating layer, the first base pedestal layer can be simultaneously formed.

Thus, the pedestal can be efficiently formed without separately adding a step, while the connecting terminal can be surely brought closer to the terminal of the slider.

BRIEF DESCRIPTION OF THE DRAWINGS

FIG. 3A shows a sectional view along an A-A line of the gimbal portion shown in FIG. 2.

FIG. 3B shows a sectional view along a B-B line of the gimbal portion shown in FIG. 2.

FIGS. 4A to 4C show process drawings for illustrating a method for producing the suspension board with circuit shown in FIG. 3B:

FIG. 4A illustrating a step of preparing a metal supporting board,

FIG. 4B illustrating a step of forming a first base insulating layer, and

FIG. 4C illustrating a step of forming a second base insulating layer.

FIG. 5D illustrating a step of forming a conductor layer,

FIG. 5E illustrating a step of forming a cover insulating layer, and

FIG. 5F illustrating a step of processing the metal supporting board.

FIGS. 6G to 6I, subsequent to FIG. 5F, show process drawings for illustrating a method for producing the suspension board with circuit shown in FIG. 3B:

FIG. 6G illustrating a step of partially removing the first base insulating layer, FIG. 6H illustrating a step of forming a plating layer, and FIG. 6I illustrating a step of mounting a slider.

FIG. 7A shows a sectional view of a second embodiment of a suspension board with circuit of the present invention corresponding to FIG. 3A.

FIG. 7B shows a sectional view of a second embodiment of a suspension board with circuit of the present invention corresponding to FIG. 3B.

DETAILED DESCRIPTION OF THE INVENTION

<First Embodiment>

Figure 1:
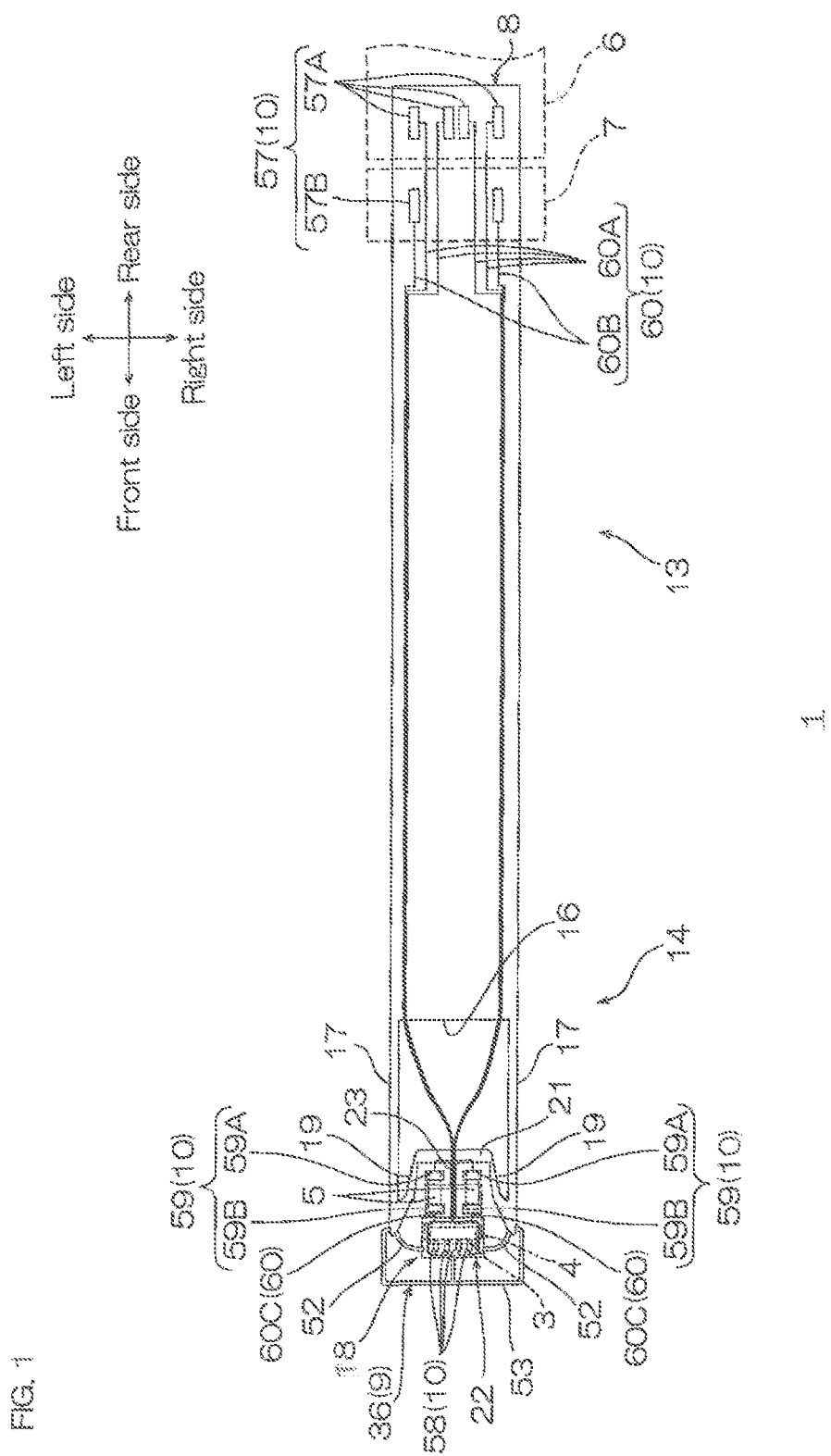
FIG. 1 shows a plan view of a first embodiment of a suspension board with circuit of the present invention.

A suspension board with circuit 1 shown in FIG. 1 is mounted with a slider 4 that is mounted with a magnetic head 3, and piezoelectric elements 5. An external board 6 and a power source 7 are connected thereto to be then mounted on a hard disk drive (not shown).

In FIG. 1, the right-left direction of the paper surface is referred to as a front-rear direction (first direction), the left side of the paper surface is referred to as a front side (one side in the first direction), and the right side of the paper surface is referred to as a rear side (the other side in the first direction). The up-down direction of the paper surface is referred to as a right-left direction (widthwise direction, second direction), the upper side of the paper surface is referred to as a left side (one side in the widthwise direction, one side in the second direction), and the lower side of the paper surface is referred to as a right side (the other side in the widthwise direction, the other side in the second direction). The paper thickness direction of the paper surface is referred to as an up-down direction (thickness direction, third direction), the near side of the paper surface is referred to as an upper side (one side in the thickness direction, one side in the third direction), and the far side of the paper surface is referred to as a lower side (the other side in the thickness direction, the other side in the third direction). To be specific, directions are in accordance with direction arrows in each view.

Figure 2:
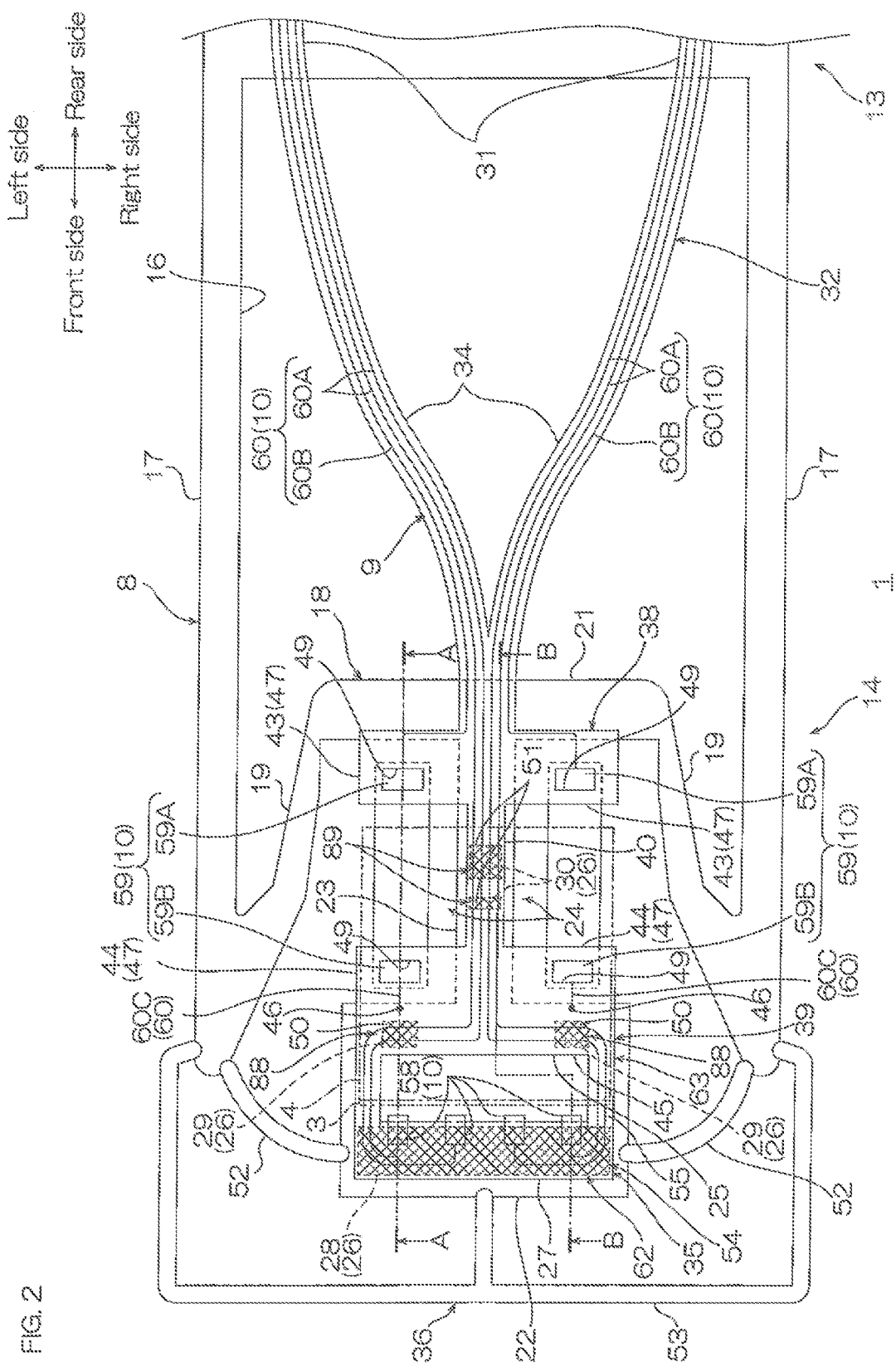
FIG. 2 shows a plan view of a gimbal portion of the suspension board with circuit shown in FIG. 1.

In FIG. 1, a base insulating layer 9 (described later) other than a bridged portion 36 (described later) and a cover insulating layer 11 are omitted. In FIG. 2, the base insulating layer 9 (a first base insulating layer 26 (described later) and a second base insulating layer 27 (described later)) is illustrated, and the cover insulating layer 11 (described later) is omitted.

As shown in FIG. 1, the suspension board with circuit 1 has a flat belt shape extending in the front-rear direction. As shown in FIGS. 3A and 3B, the suspension board with circuit 1 includes a metal supporting board 8, the base insulating layer 9 formed on the metal supporting board 8, a conductor layer 10 formed on the base insulating layer 9, the cover insulating layer 11 formed on the base insulating layer 9 so as to cover the conductor layer 10, and a plating layer 12 covering the surfaces of a plurality of terminals (external terminals 57, head-side terminals 58, and piezoelectric-side terminals 59) to be described later of the conductor layer 10.

As shown in FIG. 1, the metal supporting board 8 has a flat belt shape extending in the front-rear direction and integrally includes a main body portion 13 and a gimbal portion 14 formed at the front side of the main body portion 13.

The main body portion 13 has a generally rectangular shape in plan view extending in the front-rear direction. The main body portion 13 is supported by a load beam (not shown) of a hard disk drive, when the suspension board with circuit 1 is mounted on the hard disk drive.

As shown in FIG. 2, the gimbal portion 14 is formed so as to extend from the front end of the main body portion 13 forwardly.

The gimbal portion 14 includes one pair of outrigger portions 17, a mounting portion 18, and one pair of connecting portions 19.

The outrigger portions 17 have generally slender rectangular shapes in plan view and are formed as one pair so as to extend from both end portions in the widthwise direction of the main body portion 13 forwardly in linear shapes.

The mounting portion 18 is disposed at spaced intervals to the inner sides in the widthwise direction of the one pair of outrigger portions 17 and at spaced intervals to the front end edge of the main body portion 13 in the front-rear direction. The mounting portion 18 has a generally H-shape in plan view having an opening toward both sides in the widthwise direction. That is, both end portions in the widthwise direction of the central portion in the front-rear direction of the mounting portion 18 are cut out (have an opening). To be specific, the mounting portion 18 integrally includes a base portion 21, a stage 22, and a central portion 23.

The base portion 21 is disposed at the rear end portion of the mounting portion 18 and has a generally rectangular shape in plan view extending long in the widthwise direction.

The stage 22 is disposed at the front side of the base portion 21 at spaced intervals thereto and has a generally rectangular shape in plan view extending long in the widthwise direction. The stage 22 includes a stage opening portion 25.

As shown in FIGS. 2 and 3A, the stage opening portion 25 is formed so as to pass through the stage 22 in the thickness direction in a generally rectangular shape in plan view.

As shown in FIG. 2, the central portion 23 has a slender rectangular shape in plan view connecting the center in the widthwise direction of the base portion 21 to that in the widthwise direction of the stage 22 and extending in the front-rear direction. The central portion 23 is formed to be bendable and narrow in the widthwise direction.

In the mounting portion 18, the cut-out portion is defined as one pair of communicating spaces 24. The one pair of communicating spaces 24 are defined at both sides in the widthwise direction of the central portion 23 and formed so as to pass through the metal supporting board 8 in the thickness direction.

Each of the one pair of connecting portions 19 extends from each of the front end portions of the one pair of outrigger portions 17 toward obliquely inner rear side in the widthwise direction so as to be connected to both end portions in the widthwise direction of the base portion 21. In this manner, the one pair of connecting portions 19 connect the one pair of outrigger portions 17 to the mounting portion 18. In this manner, a board opening portion 16 in a generally U-shape having an opening forwardly in plan view is formed between the one pair of connecting portions 19 and the one pair of outrigger portions 17, and between the mounting portion 18 and the main body portion 13.

The metal supporting board 8 is, for example, formed of a metal material such as stainless steel, 42-alloy, aluminum, copper-beryllium, and phosphor bronze. Preferably, the metal supporting board 8 is formed of stainless steel.

The metal supporting board 8 has a thickness of, for example, 5 μm or more, or preferably 10 μm or more and, for example, 30 μm or less, or preferably 25 μm or less.

The base insulating layer 9 is formed on the upper surface of the metal supporting board 8 in a pattern corresponding to the conductor layer 10. The base insulating layer 9 includes the first base insulating layer 26 and the second base insulating layer 27.

The first base insulating layer 26 is disposed on the upper surface of the metal supporting board 8. The first base insulating layer 26 includes a first terminal region-insulating layer 28, one pair of first front-side base layers 29 as one example of the first base pedestal layer, and one pair of first rear-side base layers 30 as one example of the first base pedestal layer.

The first terminal region-insulating layer 28 is formed at the front side of the stage opening portion 25 in the stage 22. The first terminal region-insulating layer 28 has a generally rectangular shape in plan view extending outwardly in the widthwise direction with respect to both end portions in the widthwise direction of the stage opening portion 25. As shown in FIGS. 2 and 3A, the rear end edge of the first terminal region-insulating layer 28 coincides with the front end edge of the stage opening portion 25.

Each of the one pair of first front-side base layers 29 is disposed on the stage 22 between the one pair of communicating spaces 24 and the stage opening portion 25. The first front-side base layer 29 has a generally rectangular shape in plan view. The one pair of first front-side base layers 29 are disposed at spaced intervals to each other in the widthwise direction.

As shown in FIGS. 2 and 3B, each of the one pair of first rear-side base layers 30 is disposed on the central portion 23. The first rear-side base layer 30 has a generally rectangular shape in plan view. The one pair of first rear-side base layers 30 are disposed at spaced intervals to each other in the front-rear direction.

The first base insulating layer 26 is, for example, formed of an insulating material such as a synthetic resin. Examples of the synthetic resin include polyimide resin, polyamide imide resin, acrylic resin, polyether nitrile resin, polyether sulfone resin, polyethylene terephthalate resin, polyethylene naphthalate resin, and polyvinyl chloride resin. Preferably, the first base insulating layer 26 is formed of polyimide resin.

To be specific, the first base insulating layer 26 has a thickness of, for example, 1 μm or more, or preferably 3 μm or more and, for example, 30 μm or less, or preferably 15 μm or less.

The second base insulating layer 27 is disposed on the metal supporting board 8 so as to cover the first base insulating layer 26. The second base insulating layer 27 includes a main body portion-insulating layer 31 corresponding to the main body portion 13 and a gimbal portion-insulating layer 32 corresponding to the gimbal portion 14.

The main body portion-insulating layer 31 is formed so as to correspond to the conductor layer 10 (to be specific, the external terminals 57 and wires 60 to be described later) of the main body portion 13 shown in FIG. 1.

As shown in FIG. 2, the gimbal portion-insulating layer 32 includes a board opening portion-insulating layer 34 corresponding to the board opening portion 16, a mounting portion-insulating layer 35 corresponding to the mounting portion 18, and the bridged portion 36.

The board opening portion-insulating layer 34 is formed so as to traverse the board opening portion 16 in the front-rear direction. To be specific, the board opening portion-insulating layer 34 has a generally Y-shape in plan view extending forwardly continuously from the front ends of both end portions in the widthwise direction of the main body portion-insulating layer 31 so as to pass the board opening portion 16; branching off toward both sides in the widthwise direction at the rear side of the board opening portion 16 to be unified at the rear side with respect to the base portion 21; and extending midway in the front-rear direction of the base portion 21.

The mounting portion-insulating layer 35 has a generally H-shape in plan view corresponding to the mounting portion 18. To be specific, the mounting portion-insulating layer 35 includes a base portion-insulating layer 38, a stage insulating layer 39, and a central portion-insulating layer 40.

The base portion-insulating layer 38 is formed corresponding to the conductor layer 10 in the base portion 21 of the mounting portion 18. The base portion-insulating layer 38 has a generally rectangular shape in plan view extending continuously from the board opening portion-insulating layer 34 toward both outer sides in the widthwise direction at the front side of the base portion 21 of the mounting portion 18. The base portion-insulating layer 38 is formed so as to extend forwardly with respect to the front end edge of the base portion 21. In the base portion-insulating layer 38, portions traversing the central portion 23 and exposed from the communicating spaces 24 in the mounting portion 18 are defined as one pair of rear piezoelectric-side terminal forming portions 43.

The stage insulating layer 39 is formed corresponding to the conductor layer 10 in the stage 22 of the mounting portion 18. The stage insulating layer 39 is disposed at the front side of the base portion-insulating layer 38 at spaced intervals thereto and has a generally rectangular shape in plan view extending from the front side of the stage 22 of the mounting portion 18 rearwardly with respect to the rear end edge of the stage 22. In the stage insulating layer 39, portions traversing the central portion 23 and exposed from the communicating spaces 24 in the mounting portion 18 are defined as one pair of front piezoelectric-side terminal forming portions 44. In the stage insulating layer 39, when projected in the thickness direction, a portion overlapped with the first terminal region-insulating layer 28 is defined as a second terminal region-insulating layer 54 and a portion other than the second terminal region-insulating layer 54 is defined as a second circumferential region-insulating layer 55. In the stage insulating layer 39, when projected in the thickness direction, portions overlapped with each of the one pair of first front-side base layers 29 are defined as one pair of second front-side base layers 50 as one example of the second base pedestal layer. That is, the second front-side base layers 50 are disposed at spaced intervals to each other in the widthwise direction. The stage insulating layer 39 includes a connecting terminal-opening portion 45 corresponding to the stage opening portion 25 and a plurality (two pieces) of ground opening portions 46.

As shown in FIGS. 2 and 3A, the connecting terminal-opening portion 45 is formed so as to pass through the stage insulating layer 39 in the thickness direction in a generally rectangular shape. When projected in the thickness direction, both end edges in the widthwise direction and the rear end edge of the connecting terminal-opening portion 45 coincide with both end edges in the widthwise direction and the rear end edge of the stage opening portion 25. The front end edge of the connecting terminal-opening portion 45 is positioned rearwardly with respect to the front end edge of the stage opening portion 25.

The ground opening portions 46 are formed so as to pass through the stage insulating layer 39 in the thickness direction in a portion overlapped with the rear end portion of the stage 22 of the mounting portion 18, when projected in the thickness direction.

As shown in FIG. 2, the central portion-insulating layer 40 is formed corresponding to the conductor layer 10 in the central portion 23 of the mounting portion 18. The central portion-insulating layer 40 has a slender rectangular shape in plan view connecting the center in the widthwise direction of the base portion-insulating layer 38 to that in the widthwise direction of the stage insulating layer 39 and extending in the front-rear direction. The central portion-insulating layer 40 is formed narrower than the central portion 23 and bendable in the widthwise direction. In the central portion-insulating layer 40, when projected in the thickness direction, portions overlapped with each of the one pair of first rear-side base layers 30 are defined as one pair of second rear-side base layers 51 as one example of the second base pedestal layer. That is, the second rear-side base layers 51 are disposed at spaced intervals to each other in the front-rear direction.

The one pair of rear piezoelectric-side terminal forming portions 43 and the one pair of front piezoelectric-side terminal forming portions 44 make piezoelectric-side terminal forming portions 47.

As shown in FIGS. 2 and 3A, the piezoelectric-side terminal forming portions 47 include terminal opening portions 49.

One piece of terminal opening portion 49 is formed in each of the one pair of rear piezoelectric-side terminal forming portions 43 of the base portion-insulating layer 38 and each of the one pair of front piezoelectric-side terminal forming portions 44 of the stage insulating layer 39. The terminal opening portions 49 are formed so as to pass through the rear piezoelectric-side terminal forming portions 43 and the front piezoelectric-side terminal forming portions 44 in the thickness direction in generally rectangular shapes.

As shown in FIG. 2, the bridged portion 36 includes one pair of curved portions 52 connecting the front ends of the one pair of outrigger portions 17 to both ends in the widthwise direction of the stage 22 in curved shapes and an E-shaped portion 53 connecting the front ends of the one pair of outrigger portions 17 to the front end of the stage 22.

The curved portions 52 extend from the front ends of the outrigger portions 17 toward obliquely inner front side in the widthwise direction in curved shapes to reach both ends in the widthwise direction of the stage 22.

The E-shaped portion 53 has a generally E-shape in plan view. To be specific, the E-shaped portion 53 extends forwardly from the front ends of both of the outrigger portions 17; thereafter, bends inwardly in the widthwise direction; extends inwardly in the widthwise direction to be unified; and then, bends rearwardly to reach the center in the widthwise direction of the front end of the stage 22.

The second base insulating layer 27 is formed of the same insulating material as that of the first base insulating layer 26.

The thickness of the second base insulating layer 27 with respect to 100% of the thickness of the first base insulating layer 26 is, for example, 20% or more, or preferably 40% or more and, for example, 500% or less, or preferably 300% or less. To be specific, the second base insulating layer 27 has a thickness of, for example, 1 μm or more, or preferably 3 μm or more and, for example, 30 μm or less, or preferably 15 μm or less.

In the base insulating layer 9, a region where the first terminal region-insulating layer 28 and the second terminal region-insulating layer 54 are formed is defined as a terminal region 62. When projected in the thickness direction, a region that is not overlapped with the terminal region 62, that is, the entire region other than the terminal region 62 in the base insulating layer 9 (the region where the second circumferential region-insulating layer 55 is formed) is defined as a circumferential region 63.

As shown in FIG. 1, the conductor layer 10 includes the external terminals 57, the head-side terminals 58 as one example of the connecting terminal, the piezoelectric-side terminals 59, and the wires 60.

The plurality (six pieces) of external terminals 57 are disposed at the rear end portion of the main body portion-insulating layer 31 corresponding to the main body portion 13. The external terminals 57 include signal terminals 57A and power source terminals 57I.

Of the plurality (six pieces) of external terminals 57, four pieces thereof disposed at the rear side are the signal terminals 57A. The signal terminals 57A are disposed at spaced intervals to each other in the widthwise direction. The signal terminals 57A are electrically connected to the external board 6.

Of the plurality (six pieces) of external terminals 57, two pieces thereof disposed at the front side are the power source terminals 57B. The power source terminals 57B are disposed at spaced intervals to each other in the widthwise direction. The power source terminals 57B are electrically connected to the power source 7.

As shown in FIG. 2, the plurality (four pieces) of head-side terminals 58 are provided on the upper surface of the front end portion of the stage insulating layer 39 corresponding to the stage 22 and disposed at spaced intervals to each other in the widthwise direction. As shown in FIGS. 3A and 3B, the head-side terminal 58 extends in the front-rear direction so as to traverse the front end edge of the stage opening portion 25 and the front end edge of the connecting terminal-opening portion 45. The head-side terminal 58 is electrically connected to the magnetic head 3 via a head connecting material 66 to be described later. The head-side terminal 58 includes a front-side portion 58A, a central portion 58B, and a rear-side portion 58C.

The front-side portion 58A is a front-side portion with respect to the front end edge of the stage opening portion 25 in the head-side terminal 58. The front-side portion 58A is, when projected in the thickness direction, overlapped with the metal supporting board 8, the first terminal region-insulating layer 28 of the first base insulating layer 26, and the second base insulating layer 27. That is, the front-side portion 58A is, when projected in the thickness direction, overlapped with the terminal region 62. In other words, the terminal region 62 is, when projected in the thickness direction, overlapped with the front-side portion 58A. The front-side portion 58A supports the head-side terminal 58.

The central portion 58B is a portion between the front end edge of the stage opening portion 25 and the front end edge of the connecting terminal-opening portion 45 in the head-side terminal 58. The central portion 58B extends continuously from the rear end portion of the front-side portion 58A. The central portion 58B is, when projected in the thickness direction, overlapped with the second base insulating layer 27. The central portion 58B is disposed at the inside of the stage opening portion 25 and supported by the second base insulating layer 27.

The rear-side portion 58C is a rear-side portion with respect to the front end edge of the connecting terminal-opening portion 45 in the head-side terminal 58. The rear-side portion 58C bends downwardly continuously from the rear end portion of the central portion 58B to then extend rearwardly. In this manner, the upper surface of the rear-side portion 58C and the upper surface of the central portion 58B form a difference in level. The lower surface of the rear-side portion 58C is flush with the lower surface of the second base insulating layer 27 that is positioned at the inside of the stage opening portion 25. The rear-side portion 58C is disposed at the inside of the stage opening portion 25 and can be positioned further closer to the magnetic head 3.

The plurality (four pieces) of piezoelectric-side terminals 59 are disposed in the piezoelectric-side terminal forming portions 47 of the base insulating layer 9 in the communicating spaces 24. To be specific, each of the piezoelectric-side terminals 59 falls in and fills each of the terminal opening portions 49 of the one pair of rear piezoelectric-side terminal forming portions 43 of the base portion-insulating layer 38 and each of the terminal opening portions 49 of the one pair of front piezoelectric-side terminal forming portions 44 of the stage insulating layer 39. As shown in FIGS. 2 and 3A, of the piezoelectric-side terminals 59, the piezoelectric-side terminals 59 filling each of the terminal opening portions 49 of the one pair of rear piezoelectric-side terminal forming portions 43 are defined as rear piezoelectric-side terminals 59A, and the piezoelectric-side terminals 59 filling each of the terminal opening portions 49 of the one pair of front piezoelectric-side terminal forming portions 44 are defined as front piezoelectric-side terminals 59B. The piezoelectric-side terminals 59 are electrically connected to the piezoelectric elements 5 via a piezoelectric connecting material 68 to be described later.

As shown in FIG. 1, the plurality (six pieces) of wires 60 are formed at spaced intervals to each other in the widthwise direction in the main body portion-insulating layer 31 (ref: FIG. 2) corresponding to the main body portion 13 and the gimbal portion-insulating layer 32 (ref: FIG. 2) corresponding to the gimbal portion 14. The wires 60 include signal wires 60A and power source wires 60B.

Of the plurality (six pieces) of wires 60, four pieces thereof at the inner side in the widthwise direction are the signal wires 60A. The signal wires 60A are electrically connected to the signal terminals 57A and the head-side terminals 58. The signal wires 60A transmit electrical signals between the magnetic head 3 (ref: FIGS. 3A and 3B) and the external board 6.

To be specific, the signal wire 60A is formed so as to extend forwardly from the signal terminal 57A at the rear end portion of the main body portion-insulating layer 31 (ref: FIG. 2) corresponding to the main body portion 13 and thereafter, as shown in FIG. 2, sequentially pass over the board opening portion-insulating layer 34 and the mounting portion-insulating layer 35 to reach the head-side terminal 58.

The signal wires 60A are, when projected in the thickness direction, overlapped with the one pair of first rear-side base layers 30 of the first base insulating layer 26 in the central portion-insulating layer 40 of the mounting portion-insulating layer 35. The signal wires 60A are, when projected in the thickness direction, overlapped with the first front-side base layers 29 and the first terminal region-insulating layer 28 in the stage insulating layer 39 of the mounting portion-insulating layer 35.

As shown in FIG. 1, of the plurality (six pieces) of wires 60, two pieces thereof at both outer sides in the widthwise direction with respect to the signal wires 60A are the power source wires 60B. The power source wires 60B are electrically connected to the power source terminals 57B and the rear piezoelectric-side terminals 59A. The power source wires 60B supply electric power from the power source 7 to the piezoelectric elements 5.

To be specific, the power source wire 601 is formed so as to extend forwardly from the power source terminal 57B at the rear end portion of the main body portion-insulating layer 31 (ref: FIG. 2) corresponding to the main body portion 13 and thereafter, as shown in FIG. 2, sequentially pass over the board opening portion-insulating layer 34 and the mounting portion-insulating layer 35 to reach the rear piezoelectric-side terminal 59A.

The wires 60 include a plurality (two pieces) of ground wires 60C formed at spaced intervals to each other in the widthwise direction in the gimbal portion-insulating layer 32 corresponding to the gimbal portion 14.

The ground wires 60C are provided so as to ground the front piezoelectric-side terminals 59B. To be specific, as shown in FIGS. 2 and 3A, the ground wire 60C extends forwardly from the front piezoelectric-side terminal 59B, falls in the ground opening portion 46 at the rear side of the signal wire 60A, bends downwardly to be filled, and is brought into contact with the metal supporting board 8.

The conductor layer 10 is, for example, formed of a conductive material such as copper, nickel, gold, solder, or an alloy thereof. Preferably, the conductor layer 10 is formed of copper.

The thickness of the conductor layer 10 with respect to 100% of the thickness of the base insulating layer 9 (the total sum of the thickness of the first base insulating layer 26 and that of the second base insulating layer 27) is, for example, 10% or more, or preferably 30% or more and, for example, 200% or less, or preferably 100% or less. To be specific, the conductor layer 10 has a thickness of, for example, 3 μm or more, or preferably 5 μm or more and, for example, 50 μm or less, or preferably 20 μm or less.

As referred to FIG. 1, the cover insulating layer 11 is formed over the main body portion 13 and the gimbal portion 14. As shown in FIGS. 3A and 3B, the cover insulating layer 11 is disposed on the base insulating layer 9 and formed in a pattern including the conductor layer 10 in plan view.

To be specific, the cover insulating layer 11 is formed in a pattern covering the upper surfaces of the wires 60 and exposing the upper surfaces of the external terminals 57 (ref: FIG. 1) and the head-side terminals 58.

Portions of the cover insulating layer 11 that are, when projected in the thickness direction, overlapped with the one pair of first front-side base layers 29 and the one pair of second front-side base layers 50 are defined as one pair of front-side slider contact layers 78 as one example of the cover pedestal layer.

A first pedestal 88 as one example of the pedestal is formed of the first front-side base layer 29, the second front-side base layer 50, and the front-side slider contact layer 78. That is, the one pair of first pedestals 88 are provided. The one pair of first pedestals 88 are disposed at spaced intervals to each other in the widthwise direction.

Portions of the cover insulating layer 11 that are, when projected in the thickness direction, overlapped with the one pair of first rear-side base layers 30 and the one pair of second rear-side base layers 51 are defined as one pair of rear-side slider contact layers 79 as one example of the cover pedestal layer.

A second pedestal 89 as one example of the pedestal is formed of the first rear-side base layer 30, the second rear-side base layer 51, and the rear-side slider contact layer 79. That is, the one pair of second pedestals 89 are provided. The one pair of second pedestals 89 are disposed at spaced intervals to each other in the front-rear direction. The one pair of second pedestals 89 are disposed at the rear side with respect to the one pair of first pedestals 88 and at generally the center in the widthwise direction of the one pair of first pedestals 88. In this manner, any one of the one pair of second pedestals 89, and the one pair of first pedestals 88 are disposed in a generally triangular shape with each of them as an apex.

The cover insulating layer 11 is formed of the same insulating material as that of the base insulating layer 9 (the first base insulating layer 26 and the second base insulating layer 27). The thickness of the cover insulating layer 11 with respect to 100% of the thickness of the first base insulating layer 26 is, for example, 50% or more, or preferably 80% or more and, for example, 200% or less, or preferably 150% or less. The thickness of the cover insulating layer 11 with respect to 100% of the thickness of the second base insulating layer 27 is, for example, 10% or more, or preferably 30% or more and, for example, 100% or less, or preferably 70% or less. To be specific, the cover insulating layer 11 has a thickness of, for example, 1 μm or more, or preferably 3 μm or more and, for example, 40 μm or less, or preferably 10 μm or less.

The plating layer 12 is formed on the surfaces of the plurality of terminals, to be specific, the external terminals 57, the head-side terminals 58, and the piezoelectric-side terminals 59. The plating layer 12 is, for example, formed by plating such as electroless plating or electrolytic plating, or preferably by electrolytic plating. The plating layer 12 is, for example, formed of a metal material such as nickel and gold. Preferably, the plating layer 12 is formed of gold. The thickness of the plating layer 12 with respect to 100% of the thickness of the conductor layer 10 is, for example, 5% or more, or preferably 10% or more and, for example, 100% or less, or preferably 50% or less. To be specific, the plating layer 12 has a thickness of, for example, 0.1 μm or more, or preferably 1 μm or more and, for example, 8 μm or less, or preferably 4 μm or less.

The front end of the slider 4 is mounted with the magnetic head 3 that is capable of reading and writing the information of a hard disk. The slider 4 has a generally rectangular box shape in plan view. A plurality (four pieces) of head terminals 65 are provided at the front end of the magnetic head 3 corresponding to the plurality of head-side terminals 58.

The head terminals 65 are disposed at the front end surface of the magnetic head 3 and positioned upwardly with respect to the lower end portion of the magnetic head 3. The head terminal 65 has a length in the thickness direction and provided to face forwardly.

The slider 4 is placed on the one pair of first pedestals 88 and the one pair of second pedestals 89 via an adhesive or the like. The slider 4 is disposed at the upper sides of the head-side terminals 58 at minute spaced intervals thereto so that the head terminals 65 face the upper surfaces of the head-side terminals 58.

The head connecting material 66 is provided on the upper surface of the head-side terminal 58.

The head connecting material 66 is, for example, formed of an electrically conductive material such as solder and an electrically conductive adhesive. Preferably, the head connecting material 66 is formed of low melting point solder. Examples of the low melting point solder include solder made of an alloy of tin, silver and copper; solder made of an alloy of tin, silver, bismuth, and indium; solder made of an alloy of tin and zinc; solder made of an alloy of tin and bismuth; and solder made of an alloy of tin, bismuth, and silver. The melting point of the low melting point solder is preferably 220° C. or less. An example of the electrically conductive adhesive includes silver paste.

The head connecting material 66 electrically connects the head-side terminal 58 to the head terminal 65 of the magnetic head 3.

In this manner, in the terminal region 62, the first terminal region-insulating layer 28 of the first base insulating layer 26 and the second terminal region-insulating layer 54 of the second base insulating layer 27 are formed, so that the head-side terminals 58 are brought closer to the head terminals 65 of the magnetic head 3 mounted on the slider 4.

The piezoelectric element 5 is an actuator that is capable of extending and contracting in the front-rear direction. The piezoelectric element 5 has a generally rectangular shape in plan view extending in the front-rear direction. By supplying electric power to the piezoelectric element 5 and controlling its voltage, the piezoelectric element 5 extends and contracts. Piezoelectric terminals 67 are provided at each of the front side and the rear side of the upper portion of the piezoelectric element 5. As shown in FIGS. 2 and 3A, the one pair of piezoelectric elements 5 are disposed at spaced intervals to each other in the widthwise direction. At this time, the piezoelectric element 5 is disposed so that the rear piezoelectric-side terminal 59A and the front piezoelectric-side terminal 59B are disposed across the suspension board with circuit 1 from the lower side thereof; and the piezoelectric terminals 67 face the lower surfaces of the piezoelectric-side terminals 59.

The piezoelectric connecting material 68 is provided on the upper surface of the piezoelectric-side terminal 59. The piezoelectric connecting material 68 is, for example, formed of the same electrically conductive material as that of the head connecting material 66.

The piezoelectric connecting material 68 electrically connects the piezoelectric-side terminal 59 to the piezoelectric terminal 67 of the piezoelectric element 5.

Next, a method for producing the suspension board with circuit 1 is described with reference to FIGS. 4A to 6I.

In the method, as shown in FIG. 4A, first, the metal supporting board 8 is prepared.

Next, as shown in FIG. 4B, the first base insulating layer 26 is formed on the metal supporting board 8.

To be specific, the first base insulating layer 26 is formed on the metal supporting board 8 in a pattern corresponding to the first terminal region-insulating layer 28, the one pair of first front-side base layers 29 (ref: FIG. 3A), and the one pair of first rear-side base layers 30.

In order to form the first base insulating layer 26 including the first terminal region-insulating layer 28, the one pair of first front-side base layers 29 (ref: FIG. 3A), and the one pair of first rear-side base layers 30, a varnish of a photosensitive insulating material is applied onto the metal supporting board 8 to be then dried, thereby forming a base film.

Thereafter, the obtained base film is exposed to light via a photomask that is not shown. The photomask includes a light shielding portion and a light fully transmitting portion in a pattern. The light fully transmitting portion to a portion where the first base insulating layer 26 is formed and the light shielding portion to a portion where the first base insulating layer 26 is not formed are disposed in opposed relation to the base film to be then exposed to light.

Thereafter, the base film is developed and cured by heating as needed, thereby forming the base insulating layer 9 including the first terminal region-insulating layer 28, the one pair of first front-side base layers 29 (ref: FIG. 3A), and the one pair of first rear-side base layers 30 in the above-described pattern.

Next, as shown in FIG. 4C, the second base insulating layer 27 is formed on the metal supporting board 8 so as to cover the first base insulating layer 26.

To be specific, the second base insulating layer 27 is formed on the metal supporting board 8 in a pattern corresponding to the main body portion-insulating layer 31 (ref: FIG. 1) and the gimbal portion-insulating layer 32. The gimbal portion-insulating layer 32 is formed in a pattern including the second terminal region-insulating layer 54, the second circumferential region-insulating layer 55, the one pair of second front-side base layers 50 (ref: FIG. 3A), the one pair of second rear-side base layers 51, and the connecting terminal-opening portion 45.

In order to form the second base insulating layer 27 where the connecting terminal-opening portion 45 is formed, a varnish of a photosensitive insulating material is applied onto the metal supporting board 8 and the first base insulating layer 26 to be then dried, thereby forming a base film.

Thereafter, the obtained base film is exposed to light via a photomask that is not shown. The photomask includes a light shielding portion and a light fully transmitting portion in a pattern. The light fully transmitting portion to a portion where the base insulating layer 9 (excluding the portion where the connecting terminal-opening portion 45 is formed) is formed and the light shielding portion to a portion where the base insulating layer 9 is not formed and the connecting terminal-opening portion 45 is formed are disposed in opposed relation to the base film to be then exposed to light.

Thereafter, the base film is developed and cured by heating as needed, thereby forming the base insulating layer 9 including the second terminal region-insulating layer 54, the second circumferential region-insulating layer 55, the one pair of second front-side base layers 50, the one pair of second rear-side base layers 51, and the connecting terminal-opening portion 45 in the above-described pattern.

Figure 5D:
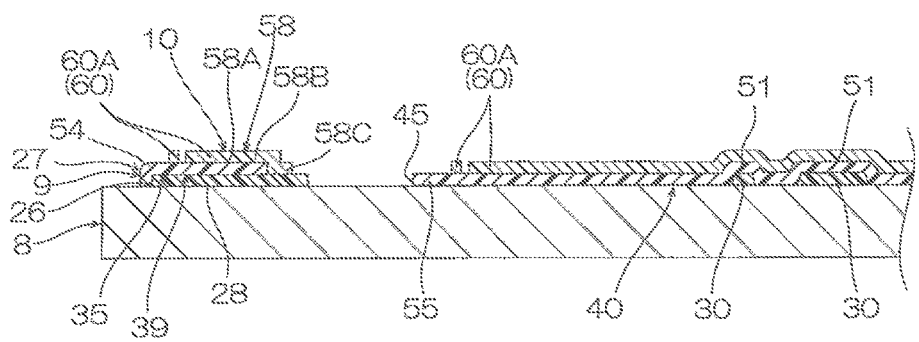
FIGS. 5D to 5F, subsequent to FIG. 4C, show process drawings for illustrating a method for producing the suspension board with circuit shown in FIG. 3B.

Next, as shown in FIG. 5D, the conductor layer 10 is formed on the upper surface of the base insulating layer 9. To be more specific, the conductor layer 10 is formed on the upper surface of the base insulating layer 9 by a pattern forming method such as an additive method or a subtractive method, or preferably by an additive method.

In this manner, as referred to FIG. 1, the conductor layer 10 is formed on the upper surface of the base insulating layer 9 so as to include the external terminals 57, the head-side terminals 58, the piezoelectric-side terminals 59, and the wires 60. The rear-side portion 58C of the head-side terminal 58 is formed so as to fall in the upper surface of the first terminal region-insulating layer 28.

Figure 5E:
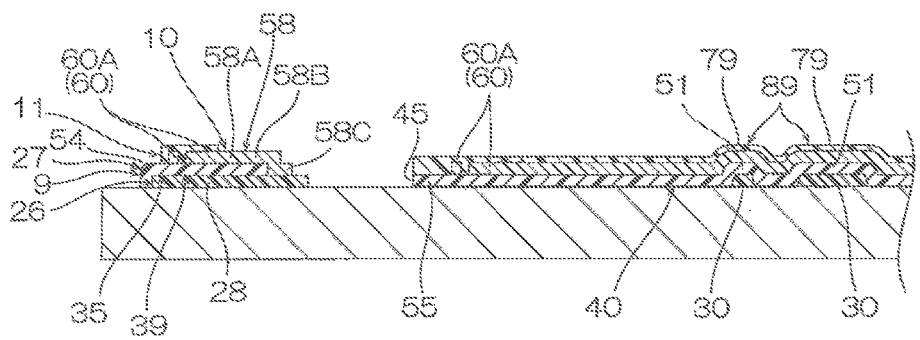

Next, as shown in FIG. 5E, the cover insulating layer 11 is formed on the second base insulating layer 27 in a pattern including the one pair of front-side slider contact layers 78 (ref: FIG. 3A) and the one pair of rear-side slider contact layers 79. In order to form the cover insulating layer 11 including the one pair of front-side slider contact layers 78 (ref: FIG. 3A) and the one pair of rear-side slider contact layers 79, a varnish of a photosensitive insulating material is applied onto the second base insulating layer 27 and the conductor layer 10 to be then dried. After forming a cover film, the obtained cover film is exposed to light and subsequently, developed to be then cured by heating. In this manner, the cover insulating layer 11 is formed in the above-described pattern.

In this manner, as referred to FIG. 3A, the one pair of front-side slider contact layers 78 constitute the first pedestals 88 along with the corresponding one pair of second front-side base layers 50 of the second base insulating layer 27 and the one pair of first front-side base layers 29 of the first base insulating layer 26.

As shown in FIG. 5E, the one pair of rear-side slider contact layers 79 constitute the second pedestals 89 along with the corresponding one pair of second rear-side base layers 51 of the second base insulating layer 27 and the one pair of first rear-side base layers 30 of the first base insulating layer 26.

Figure 5F:
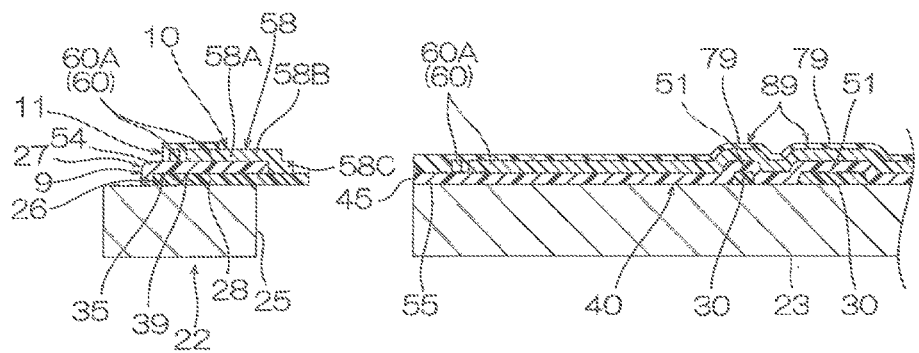

Next, as shown in FIG. 5F, the metal supporting board 8 is, for example, processed by etching or the like so that the board opening portion 16 (ref: FIGS. 1 and 2) and the stage opening portion 25 are formed.

In this manner, the lower surface of the rear end portion of the first terminal region-insulating layer 28 is exposed from the stage opening portion 25.

Next, as shown in FIG. 6G, in the base insulating layer 9, the rear end portion of the first terminal region-insulating layer 28 exposed from the stage opening portion 25 is removed, to be specific, by etching, or preferably by wet etching or the like.

In this manner, the lower surface of the rear end portion of the second terminal region-insulating layer 54 is exposed and the lower surfaces of the rear-side portions 58C of the head-side terminals 58 are exposed.

Next, as shown in FIG. 6H, the plating layer 12 is formed on the surfaces of the plurality of terminals, to be specific, the external terminals 57, the head-side terminals 58, and the piezoelectric-side terminals 59.

To be specific, the plating layer 12 is formed by plating such as electroless plating or electrolytic plating, or preferably by electrolytic plating.

In this manner, the suspension board with circuit 1 is completed.

Next, as shown in FIG. 6I, when the slider 4 mounted with the magnetic head 3 is connected to the suspension board with circuit 1, first, the head connecting material 66 is formed on the head-side terminal 58 (the plating layer 12). To be specific, the above-described electrically conductive material is printed with a known printer or applied with a dispenser, thereby forming the head connecting material 66.

Next, the slider 4 mounted with the magnetic head 3 is disposed at the upper side of the suspension board with circuit 1 so that the slider 4 is supported by the one pair of first pedestals 88 (ref: FIGS. 2 and 3A) and the one pair of second pedestals 89, and the head terminals 65 are positioned at the upper sides of the head-side terminals 58.

Then, the head connecting material 66 is heated at a temperature of not less than the melting point thereof by a heating method such as laser (Xe lamp laser) application or soldering iron. Preferably, the head connecting material 66 is heated by laser application.

In this manner, as shown in FIGS. 3A and 3B, the head connecting material 66 is melted and flows, so that the head-side terminal 58 is electrically connected to the head terminal 65 of the magnetic head 3.

At this time, the head connecting material 66 forms a fillet, so that the head connecting material 66 can be surely disposed till the upper end portion of the head terminal 65, and the head-side terminal 58 can be surely electrically connected to the head terminal 65.

As shown in FIG. 3A, when the piezoelectric elements 5 are connected to the suspension board with circuit 1, first, the piezoelectric connecting material 68 is formed below the piezoelectric-side terminal 59. To be specific, the above-described electrically conductive material is printed with a known printer or applied with a dispenser, thereby forming the piezoelectric connecting material 68.

The one pair of piezoelectric elements 5 are disposed at the lower side of the suspension board with circuit 1 so that the piezoelectric terminals 67 are positioned at the lower sides of the corresponding piezoelectric-side terminals 59.

Next, the gimbal portion 14 of the suspension board with circuit 1 where the piezoelectric elements 5 are disposed is put into a reflow oven and heated, so that the piezoelectric connecting material 68 is subjected to reflowing.

The reflow temperature is not less than the temperature at which the piezoelectric connecting material 68 is melted and, for example, 100° C. or more, or preferably 130° C. or more and, for example, 350° C. or less, or preferably 300° C. or less.

The reflow time is, for example, 5 seconds or more, or preferably 10 seconds or more and, for example, 500 seconds or less, or preferably 300 seconds or less.

In this manner, the piezoelectric connecting material 68 flows by being melted to connect the piezoelectric-side terminal 59 to the piezoelectric terminal 67 of the piezoelectric element 5.

By supplying electric power to the piezoelectric element 5 from the power source 7 via the piezoelectric-side terminal 59 and controlling its voltage, the piezoelectric element 5 extends and contracts in the front-rear direction. The position of the slider 4 can be precisely and finely adjusted by extending and contracting of the piezoelectric element 5.

According to the suspension board with circuit 1, as shown in FIGS. 3A and 3B, the thickness of the terminal region 62 is thicker than that of the circumferential region 63, so that the head-side terminals 58 can be brought closer to the head terminals 65 of the magnetic head 3 of the slider 4 in the thickness direction.

Thus, the head-side terminals 58 can be surely connected to the head terminals 65.

On the other hand, the thickness of the circumferential region 63 is thinner than that of the terminal region 62, so that light weight and thinning of the suspension board with circuit 1 can be achieved.

According to the suspension board with circuit 1, as shown in FIGS. 3A and 3B, the terminal region 62 includes the first terminal region-insulating layer 28 made of the first base insulating layer 26 and the second terminal region-insulating layer 54 made of the second base insulating layer 27, while the circumferential region 63 includes the second circumferential region-insulating layer 55 made of the second base insulating layer 27.

Thus, compared to a case where the terminal region 62 is formed of one layer of the base insulating layer 9, by forming the thickness of the terminal region 62 in two layers, that is, the first terminal region-insulating layer 28 and the second terminal region-insulating layer 54, the thickness of the terminal region 62 can be easily formed thicker than that of the circumferential region 63.

As a result, the head-side terminals 58 can be brought closer to the terminal of the slider 4, so that the head-side terminals 58 can be more surely connected to the head terminals 65 of the magnetic head 3 of the slider 4.

According to the suspension board with circuit 1, as shown in FIGS. 3A and 3B, the one pair of first front-side base layers 29 and the one pair of first rear-side base layers 30 are made of the first base insulating layer 26, the one pair of second front-side base layers 50 and the one pair of second rear-side base layers 51 are made of the second base insulating layer 27, and the one pair of front-side slider contact layers 78 and the one pair of rear-side slider contact layers 79 are made of the cover insulating layer 11, so that the one pair of first pedestals 88 and the one pair of second pedestals 89 can be formed by covering the wires 60 without separately providing a member so as to support the slider 4.

According to the method for producing the suspension board with circuit 1, as shown in FIGS. 3A and 3B, the suspension board with circuit 1 in which the thickness of the terminal region 62 is thicker than that of the circumferential region 63, and the head-side terminals 58 can be brought closer to the terminal of the slider 4 in the thickness direction can be produced.

Also, as shown in FIG. 4C, in the steps of forming the second terminal region-insulating layer 54 and the second circumferential region-insulating layer 55, the one pair of second front-side base layers 50 and the one pair of second rear-side base layers 51 can be simultaneously formed.

Thus, the one pair of first pedestals 88 and the one pair of second pedestals 89 can be efficiently formed without separately adding a step, while the head-side terminals 58 can be surely brought closer to the terminal of the slider 4.

<Second Embodiment>

Next, a second embodiment of the suspension board with circuit 1 of the present invention is described with reference to FIGS. 7A and 7B. In the second embodiment, the same reference numerals are provided for members corresponding to each of those in the above-described first embodiment, and their detailed description is omitted.

In the above-described first embodiment, the first base insulating layer 26 includes only the first terminal region-insulating layer 28, the one pair of first front-side base layers 29, and the one pair of first rear-side base layers 30; and the second base insulating layer 27 includes the main body portion-insulating layer 31 corresponding to the main body portion 13 and the gimbal portion-insulating layer 32 corresponding to the gimbal portion 14.

In contrast, in the second embodiment, the first base insulating layer 26 includes the main body portion-insulating layer 31 corresponding to the main body portion 13 and the gimbal portion-insulating layer 32 corresponding to the gimbal portion 14; and the second base insulating layer 27 includes only the second terminal region-insulating layer 54, the one pair of second front-side base layers 50, and the one pair of second rear-side base layers 51 without including the second circumferential region-insulating layer 55.

In the stage insulating layer 39 of the first base insulating layer 26, a portion overlapped with the second terminal region-insulating layer 54 is defined as the first terminal region-insulating layer 28. In other words, the second terminal region-insulating layer 54 is disposed on the first terminal region-insulating layer 28. In the first base insulating layer 26, a portion other than the first terminal region-insulating layer 28 is defined as a first circumferential region-insulating layer 95.

In the base insulating layer 9, a region where the first terminal region-insulating layer 28 and the second terminal region-insulating layer 54 are formed is defined as the terminal region 62. When projected in the thickness direction, a region that is not overlapped with the terminal region 62, that is, the entire region other than the terminal region 62 in the base insulating layer 9 (the region where the first circumferential region-insulating layer 95 is formed) is defined as the circumferential region 63.

In order to produce the suspension board with circuit 1, in the step of forming the first base insulating layer 26 of the above-described first embodiment on the metal supporting board 8, in the second embodiment, the first base insulating layer 26 is formed on the metal supporting board 8 in a pattern corresponding to the main body portion-insulating layer 31 (ref: FIG. 1) and the gimbal portion-insulating layer 32. The gimbal portion-insulating layer 32 is formed in a pattern including the first terminal region-insulating layer 28, the first circumferential region-insulating layer 95, the one pair of first front-side base layers 29, the one pair of first rear-side base layers 30, and the connecting terminal-opening portion 45.

In the step of forming the second base insulating layer 27 of the above-described first embodiment on the metal supporting board 8 so as to cover the first base insulating layer 26, in the second embodiment, the second base insulating layer 27 is formed on the first base insulating layer 26 in a pattern including the second terminal region-insulating layer 54, the one pair of second front-side base layers 50, and the one pair of second rear-side base layers 51.

The suspension board with circuit 1 is produced by the same producing method as that of the first embodiment except for the above-described steps.

As described above, the second embodiment of the suspension board with circuit 1 is completed.

According to the suspension board with circuit 1, as shown in FIGS. 7A and 7B, the terminal region 62 includes the first terminal region-insulating layer 28 made of the first base insulating layer 26 and the second terminal region-insulating layer 54 made of the second base insulating layer 27, while the circumferential region 63 includes the first circumferential region-insulating layer 95 made of the first base insulating layer 26.

Thus, compared to a case where the terminal region 62 is formed of one layer of the base insulating layer 9, by forming the thickness of the terminal region 62 in two layers, that is, the first terminal region-insulating layer 28 and the second terminal region-insulating layer 54, the thickness of the terminal region 62 can be easily formed thicker than that of the circumferential region 63.

As a result, the head-side terminals 58 can be brought closer to the head terminals 65 of the magnetic head 3 of the slider 4, so that the head-side terminals 58 can be more surely connected to the head terminals 65.

According to the suspension board with circuit 1, as shown in FIGS. 7A and 7B, the one pair of first front-side base layers 29 and the one pair of first rear-side base layers 30 are made of the first base insulating layer 26, the one pair of second front-side base layers 50 and the one pair of second rear-side base layers 51 are made of the second base insulating layer 27, and the one pair of front-side slider contact layers 78 and the one pair of rear-side slider contact layers 79 are made of the cover insulating layer 11, so that the one pair of first pedestals 88 and the one pair of second pedestals 89 can be formed by covering the wires 60 without separately providing a member so as to support the slider 4.

According to the method for producing the suspension board with circuit 1, as shown in FIGS. 7A and 7B, the suspension board with circuit 1 in which the thickness of the terminal region 62 is thicker than that of the circumferential region 63, and the head-side terminals 58 can be brought closer to the terminal of the slider 4 in the thickness direction can be produced.

Also, in the steps of forming the first terminal region-insulating layer 28 and the first circumferential region-insulating layer 95, the one pair of first front-side base layers 29 and the one pair of first rear-side base layers 30 can be simultaneously formed.

Thus, the pedestals can be efficiently formed without separately adding a step, while the head-side terminals 58 can be surely brought closer to the terminal of the slider 4.

<Modified Example>

In the above-described first and second embodiments, the suspension board with circuit 1 includes the first pedestal 88 and the second pedestal 89 so as to support the slider 4. However, the slider 4 may be also supported by an adhesive layer or the like without including the first pedestal 88 and the second pedestal 89.

In the modified example, the same function and effect as that of the first and second embodiments can be obtained.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A suspension board with circuit comprising:
a metal supporting board, a base insulating layer disposed at one side in a thickness direction of the metal supporting board, and a conductor layer disposed at one side in the thickness direction of the base insulating layer and including a connecting terminal electrically connected to a slider, wherein:
the base insulating layer includes a first base insulating layer disposed at the one side in the thickness direction of the metal supporting board and a second base insulating layer covering the first base insulating layer and disposed at the one side in the thickness direction of the metal supporting board,
the base insulating layer has a terminal region, when projected in the thickness direction, overlapped with at least the connecting terminal and a circumferential region not overlapped with the terminal region and around the terminal region,
in an entire region of the base insulating layer, the conductor layer is not located between the first base insulating layer and the second base insulating layer, and
the thickness of the terminal region is thicker than that of the circumferential region.

2. The suspension board with circuit according to claim 1, wherein
the terminal region includes
a first terminal region-insulating layer made of the first base insulating layer and disposed at the one side in the thickness direction of the metal supporting board and
a second terminal region-insulating layer made of the second base insulating layer and disposed at one side in the thickness direction of the first terminal region-insulating layer; and
the circumferential region includes at least a second circumferential region-insulating layer made of the second base insulating layer and disposed at the one side in the thickness direction of the metal supporting board.

3. The suspension board with circuit according to claim 2 further comprising:

a cover insulating layer covering the conductor layer so as to expose the connecting terminal and disposed at the one side in the thickness direction of the base insulating layer and a pedestal supporting the slider, wherein the pedestal includes a first base pedestal layer made of the first base insulating layer and disposed at the one side in the thickness direction of the metal supporting board, a second base pedestal layer made of the second base insulating layer and disposed at one side in the thickness direction of the first base pedestal layer, and a cover pedestal layer made of the cover insulating layer and disposed at one side in the thickness direction of the second base pedestal layer.

4. The suspension board with circuit according to claim 1, wherein the terminal region includes a first terminal region-insulating layer made of the first base insulating layer and disposed at the one side in the thickness direction of the metal supporting board and a second terminal region-insulating layer made of the second base insulating layer and disposed at one side in the thickness direction of the first terminal region-insulating layer; and the circumferential region includes at least a first circumferential region-insulating layer made of the first base insulating layer and disposed at the one side in the thickness direction of the metal supporting board.

5. The suspension board with circuit according to claim 4 further comprising:

a cover insulating layer covering the conductor layer so as to expose the connecting terminal and disposed at the one side in the thickness direction of the base insulating layer and a pedestal supporting the slider, wherein the pedestal includes a first base pedestal layer made of the first base insulating layer and disposed at the one side in the thickness direction of the metal supporting board, a second base pedestal layer made of the second base insulating layer and disposed at one side in the thickness direction of the first base pedestal layer, and a cover pedestal layer made of the cover insulating layer and disposed at one side in the thickness direction of the second base pedestal layer.

\* \* \* \* \*